(12) United States Patent
Baratam

(10) Patent No.: US 11,405,040 B2
(45) Date of Patent: Aug. 2, 2022

(54) LOGIC CONFIGURATION TECHNIQUES

(71) Applicant: Arm Limited, Cambridge (GB)

(72) Inventor: Anil Kumar Baratam, Bangalore (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/991,018

(22) Filed: Aug. 12, 2020

(65) Prior Publication Data

US 2021/0305985 A1 Sep. 30, 2021

(30) Foreign Application Priority Data

Mar. 27, 2020 (IN) .............................. 202041013401

(51) Int. Cl.
| | |
|---|---|
| *H03K 3/356* | (2006.01) |
| *H03K 19/094* | (2006.01) |
| *H03K 19/0944* | (2006.01) |
| *H03K 3/0233* | (2006.01) |
| *H03K 19/173* | (2006.01) |
| *H03K 19/17736* | (2020.01) |

(52) U.S. Cl.
CPC ..... *H03K 19/09425* (2013.01); *H03K 3/0233* (2013.01); *H03K 19/0944* (2013.01); *H03K 19/1733* (2013.01); *H03K 19/17744* (2013.01)

(58) Field of Classification Search
CPC ........... H03K 3/0233; H03K 19/09425; H03K 19/0944; H03K 19/1733; H03K 19/17744
See application file for complete search history.

(56) References Cited

U.S. PATENT DOCUMENTS

| | | | | |
|---|---|---|---|---|
| 8,896,362 | B2 * | 11/2014 | Chen ..................... | H03K 17/162 327/108 |
| 2006/0092716 | A1 * | 5/2006 | Nam ....................... | G11C 16/26 365/189.05 |
| 2012/0223739 | A1 * | 9/2012 | Jung ................. | H03K 3/356121 326/46 |
| 2012/0319754 | A1 * | 12/2012 | Lee .......................... | H02M 1/38 327/208 |
| 2015/0200651 | A1 * | 7/2015 | Baratam ................. | H03K 3/012 327/202 |
| 2017/0030968 | A1 * | 2/2017 | Warnock ............. | G01R 31/2896 |
| 2017/0141766 | A1 * | 5/2017 | Kao .................... | H03K 3/35625 |
| 2019/0028091 | A1 * | 1/2019 | Baratam ................. | H03K 3/012 |

* cited by examiner

*Primary Examiner* — Kurtis R Bahr
(74) *Attorney, Agent, or Firm* — Pramudji Law Group PLLC; Ari Pramudji

(57) ABSTRACT

Various implementations described herein are directed to a device having logic circuitry with multiple inversion stages. One or more of the multiple inversion stages may be configured to operate as first inversion logic with a first number of transistors. One or more of the multiple inversion stages may be configured to operate as second inversion logic with a second number of transistors that is greater than the first number of transistors.

19 Claims, 7 Drawing Sheets

LOGIC CONFIGURATION TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some computing architecture, radiation is a consistent threat to security and resiliency of modern systems, wherein any radiation can induce external charge into an otherwise robust system, thus causing system malfunction. Sometimes, external charge can be triggered by application of a current pulse due to accumulated charge in memory storage elements. In some cases, memories usually incorporate redundancy to combat these soft errors, which can be difficult to implement in logic due to vast cell population in small areas. As such, there exists a need to overcome radiation threats to critical flip-flop circuitry in logic by identifying and replacing sensitive memory architecture with hardened logic circuitry to improve overall system failure-in-time rate (FIT rate).

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to configurable latching schemes and techniques. For instance, the various schemes and techniques described herein may provide for a multi-stage latch circuit (or flip-flop circuit) that provides for higher resilience against radiation, such as, e.g., a four-stage latch, that makes any glitch pulse traverse four elements before flipping (or toggling) the logic state of the latch. Thus, short duration pulses that pass through a tri-state inverter are filtered and not transferred to a next stage, such that the pulse_duration<2 inverter delays. In some implementations, the multi-stage latch circuit may be referred to as a hardened latch or a hardened flip-flop (FF). In other implementations, the multi-stage latch circuit (or flip-flop circuit) may be referred to as a soft error resilient latch circuit (or flip-flop circuit).

Also, various implementations described herein provide for logic circuitry having multiple inversion stages that are configured to operate as first inversion logic or second inversion logic that is different than the first inversion logic. For instance, one or more of the multiple inversion stages may be configured to operate as two-state inversion logic, and also, one or more of the multiple inversion stages may be configured to operate as tri-state inversion logic. In some implementations, the multiple inversion stages may have four-transistor (4T) logic that is selectively configurable to operate as two-transistor (2T) inversion logic or four-transistor (4T) inversion logic. In some other implementations, the multiple inversion stages may include two-transistor (2T) logic circuitry that is configured to operate as two-transistor (2T) inversion logic and four-transistor (4T) logic circuitry that is configured to operate as four-transistor (4T) inversion logic.

Various implementations of configurable latching schemes and techniques will be described in detail herein with reference to FIGS. 1-5.

Figure 1:
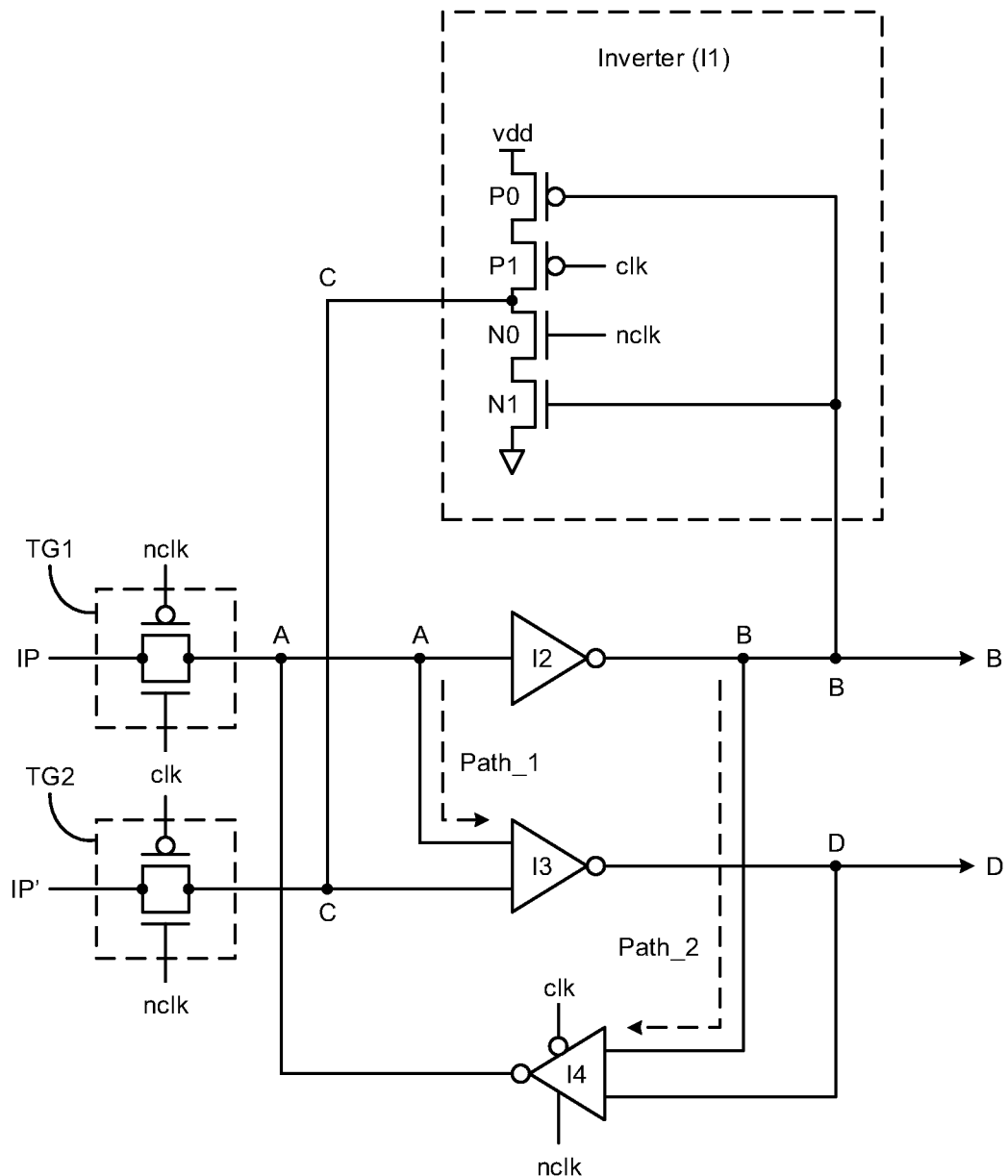
FIG. 1 illustrates a diagram of latch circuitry having a first logic configuration in accordance with various implementations described herein.

FIG. 1 illustrates a schematic diagram 100 of latch circuitry 102 having a first logic configuration in accordance with various implementations described herein.

In various implementations, the latch circuitry 102 may be implemented as a system or a device having various integrated circuit (IC) components that are arranged and coupled together as an assemblage or combination of parts that provide for a physical circuit design and related structures. In some instances, a method of designing, providing and building the latch circuitry 102 as an integrated system or device that may involve use of various IC circuit components described herein so as to implement latch configuring schemes and techniques associated therewith. The latch circuitry 102 may be integrated with computing circuitry and related components on a single chip, and the latch circuitry 102 may be implemented in embedded systems for electronic, mobile and Internet-of-things (IoT) applications, including sensor nodes.

As shown in FIG. 1, the latch circuitry 102 may refer to logic circuitry having multiple inversion stages (I1, I2, I3, I4). In some implementations, the multiple inversion stages may include configurable inversion stages that are implemented to operate as two-state inverters or tri-state inverters. For instance, the multiple inversion stages may refer to first inversion stages that are configured to operate as first inversion logic with a first number of transistors. Also, the multiple inversion stages may include second inversion stages that are configured to operate as second inversion logic with a second number of transistors that is greater than the first number of transistors.

In some instances, the first inversion stages may be configured to operate as two-state inverters, and the first number of transistors may include two transistors. Also, in some instances, the first inversion logic may be configured to operate as two-transistor (2T) inversion logic. Also, in some instances, the first number of transistors may include at least one p-type transistor and at least one n-type transistor.

In some instances, the second inversion stages may be configured to operate as tri-state inverters, and the second number of transistors may include three or more transistors (>3T). In other instances, the second inversion logic (e.g., tri-state inversion logic) may be configured to operate as four-transistor (4T) inversion logic. Also, in some instances, the second number of transistors may include at least two p-type transistors and at least two n-type transistors.

In various implementations, as shown in FIG. 1, the multiple inversion stages may include a first inversion stage (I1), a second inversion stage (I2), a third inversion stage (I3), and/or a fourth inversion stage (I4) that are arranged and coupled together to provide various configurable latching techniques as described herein. The first inversion stage (I1) may be coupled between an output of the second inversion stage (I2) at node (B) and an input of the third inversion stage (I3) at node (C). The second inversion stage (I2) may be coupled between a first input (IP) of the latch circuitry 102 and a first output (e.g., at node (B)) of the latch circuitry 102. The third inversion stage (I3) may be coupled between a second input (IP') of the logic circuitry 102 and a second output (e.g., at node (D)) of the logic circuitry 102. The fourth inversion stage (I4) may be coupled between an output of the third inversion stage (I3) at node (D) and an input of the second inversion stage (I2) at node (A).

In some implementations, the latch circuitry 102 may include various other logic circuitry, including one or more transmission gates, such as, e.g., a first transmission gate (TG1) coupled to the first input (IP) of the logic circuitry 102 and a second transmission gate (TG2) coupled to the second input (IP') of the logic circuitry 102. In some instances, the first transmission gate (TG1) may include multiple transistors (e.g., a p-type transistor and an n-type transistor) that are arranged and coupled together so as to receive the input signal (IP) and provide the input signal (IP) to node (A) based on complementary clock signals (clk, nclk) that are respectively coupled to gates of the multiple transistors. Also, in some instances, the second transmission gate (TG2) may include multiple transistors (e.g., a p-type transistor and an n-type transistor) that are arranged and coupled together so as to receive the input signal (IP') and provide the input signal (IP') to node (C) based on the complementary clock signals (clk, nclk) that are respectively coupled to gates of the multiple transistors.

In some implementations, the first latch (I1) and the second latch (I2) may be configured as single-input inverters that operate as two-state inversion logic. As shown in FIG. 1, the first inverter (I1) may receive an input signal via node (B) and provide an inverted output signal to node (C). Also, the second inverter (I2) may receive an input signal via node (A) and provide an inverted output signal to node (B).

In some implementations, the third latch (I3) and the fourth latch (I4) may be configured as two-input inverters that operate as tri-state inversion logic. As shown in FIG. 1, the third inverter (I3) may receive a first input signal via node (A), receive a second input signal via node (C), and provide an inverted output signal to node (D). Also, the fourth inverter (I4) may receive a first input signal via node (B), receive a second input signal via node (D), and provide an inverted output signal to node (A). In some instances, a first path (Path_1) may be coupled between the input of the second inversion stage (I2) at node (A) and the first input of the third inversion stage (I3). Also, in some instances, a second path (Path_2) may be coupled between the output of the second inversion stage (I2) at node (B) and the first input of the fourth inversion stage (I4).

In some implementations, as shown in FIG. 1, the first inversion stage (I1) may be configured as two-state inversion logic with multiple transistors (e.g., P0, P1, N0, N1) coupled in series between a voltage supply (vdd) and ground (gnd or vss). In some instances, the number of transistors may include a first p-type transistor (P0) and a second p-type transistor (P1) coupled in series between the voltage supply (vdd) and the output at node C. Also, the number of transistors may include a first n-type transistor (N0) and a second n-type transistor (N1) that are coupled in series between the output at node C and ground (gnd or vss). The first p-type transistor (P0) may have a gate coupled to node (B), and the second p-type transistor (P1) may be activated with a clock signal (clk). Also, the first n-type transistor (N0) may be activated with a second clock signal (nclk) that is a complement to the first clock signal (clk), and the second n-type transistor (N1) may have a gate coupled to node (B). In other implementations, the first inversion stage (I1) may be configured for tri-state inversion logic with the multiple transistors (P0, P1, N0, N1) being configured to provide tri-state inversion logic.

In some implementations, the second inversion stage (I2) may be configured as two-state inversion logic with multiple transistors that may include two transistors or four transistors, such as, e.g., one or more p-type transistors and one or more n-type transistors, that are configured to operate as a two-transistor (2T) inverter. The second inversion stage (I2) may receive the input signal (IP) via node (A) and provide an inverted output signal via node (B). In other implementations, the second inversion stage (I2) may be configured for tri-state inversion logic with multiple transistors (e.g., four transistors) being arranged and configured to provide the tri-state inversion logic.

In some implementations, the third inversion stage (I3) may be configured as tri-state inversion logic with multiple transistors that may include four transistors, such as, e.g., two or more p-type transistors and two or more n-type transistors, that are arranged and configured to operate as a four-transistor (4T) inverter. The third inversion stage (I3) may receive the input signal (IP') via node (C), receive the other input signal (IP) via node (A), and provide an inverted output signal via node (D). Also, in other implementations, the third inversion stage (I3) may be configured for two-state inversion logic with multiple transistors (e.g., two transistors or four transistors) being arranged and configured to provide the two-state inversion logic.

In some implementations, the fourth inversion stage (I4) may be configured as tri-state inversion logic with multiple transistors that may include four transistors, such as, e.g., two or more p-type transistors and two or more n-type transistors, that are arranged and configured to operate as a four-transistor (4T) inverter. The fourth inversion stage (I4) may receive the output signal (B) via node (B), receive the other output signal (D) via node (D), and provide an inverted output signal via node (A). In other implementations, the fourth inversion stage (I4) may be configured for two-state inversion logic with multiple transistors (e.g., two transistors or four transistors) being arranged and configured to provide the two-state inversion logic. In addition, in some instances, the fourth inversion stage (I4) may receive the clock signal (clk) at a first inverting power supply input, and the fourth inversion stage may also receive the complementary clock signal (nclk) at a second non-inverting power supply input.

Figure 2:
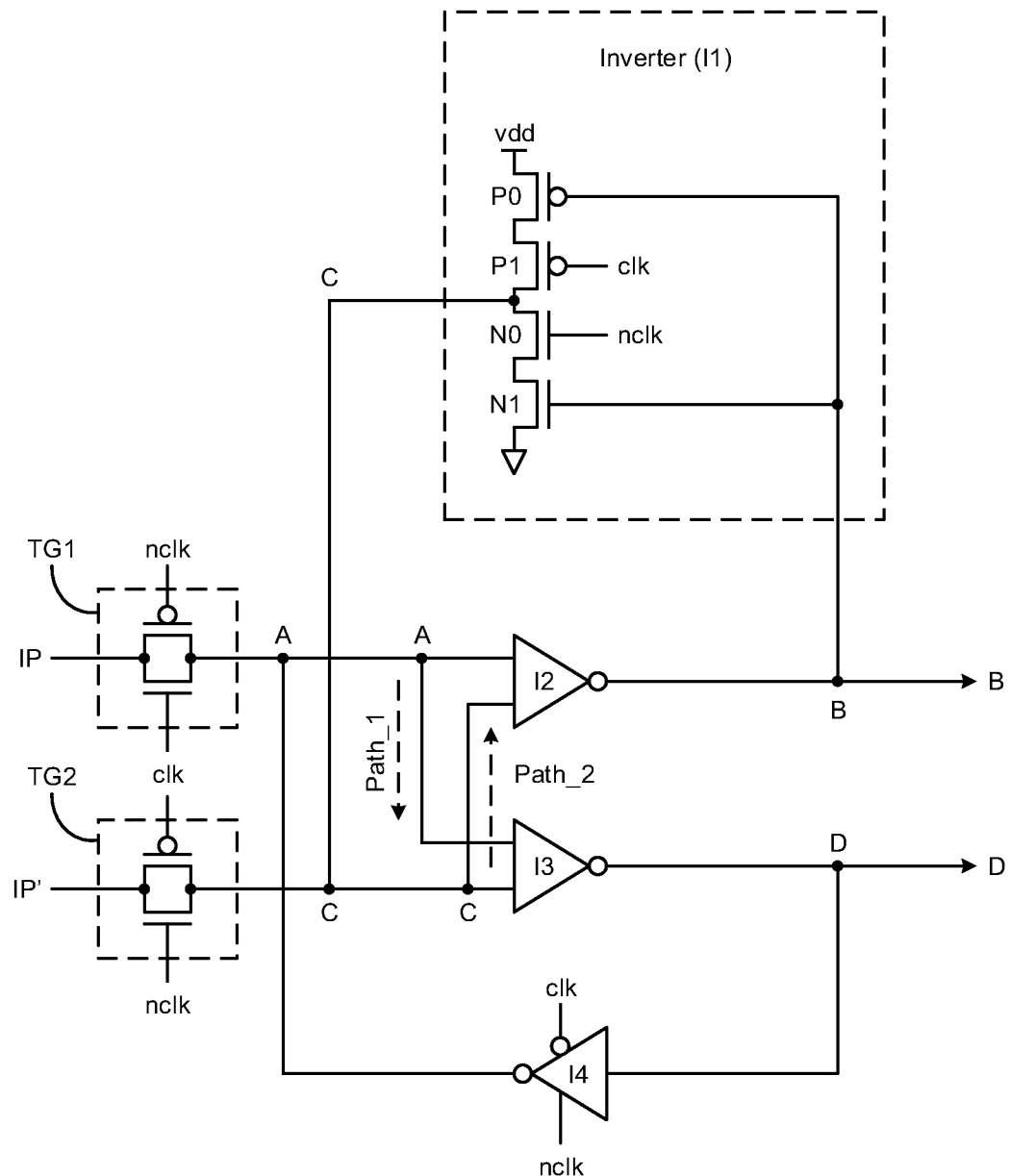
FIG. 2 illustrates another diagram of the latch circuitry having a second logic configuration in accordance with various implementations described herein.

FIG. 2 illustrates a diagram 200 of latch circuitry 202 having a second logic configuration in accordance with implementations described herein. In some instances, the latch circuitry 202 of FIG. 2 has similar logic components with similar features and operational characteristics as the latch circuitry 102 in FIG. 1.

In some implementations, as shown in FIG. 2, the latch circuitry 202 includes multiple inversion stages, such as, e.g., the first inversion stage (I1), the second inversion stage (I2), the third inversion stage (I3), and/or the fourth inversion stage (I4), which may be arranged and coupled together to provide various configurable latching techniques as described herein. In some instances, the first latch (I1) and the fourth latch (I2) may be configured as single-input inverters that operate as two-state inversion logic. As shown in FIG. 2, the first inverter (I1) may receive an input signal via node (B) and provide an inverted output signal to node (C). In addition, the fourth inverter (I4) may receive an input signal via node (D) and provide an inverted output signal to node (A).

In some implementations, the second latch (I2) and the third latch (I3) may be configured as two-input inverters that operate as tri-state inversion logic. As shown in FIG. 2, the second inverter (I2) may receive a first input signal via node (A), receive a second input signal via node (C), and provide an inverted output signal to node (B). Also, the third inverter (I3) may receive a first input signal via node (A), receive a second input signal via node (C), and provide an inverted output signal to node (D). In some instances, a first path (Path_1) may be coupled between a first input of the second inversion stage (I2) at node (A) and a first input of the third inversion stage (I3). Also, in some instances, a second path (Path_2) may be coupled between a second input of the third inversion stage (I3) at node (C) and a second input of the second inversion stage (I2).

Figure 3:
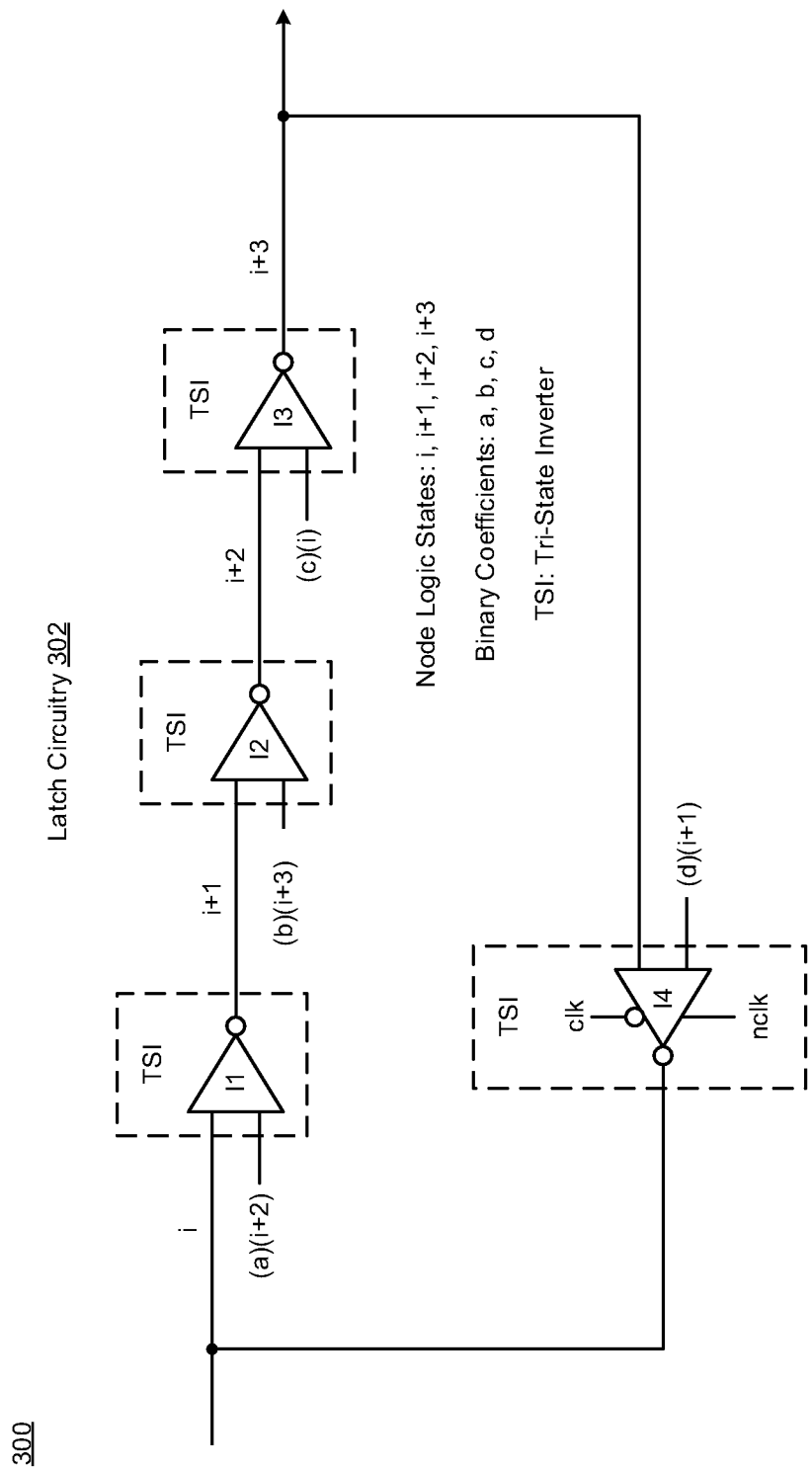
FIG. 3 illustrates a diagram of latch circuitry having multiple inversion stages in accordance with various implementations described herein.

FIG. 3 illustrates a diagram 300 of latch circuitry 302 having multiple inversion stages in accordance with various implementations described herein. In some instances, the latch circuitry 302 of FIG. 3 may have similar logic components with similar features and operational characteristics as the latch circuitry 102, 202 in FIGS. 1-2.

In various implementations, the latch circuitry 302 may be implemented as a system or a device having various integrated circuit (IC) components that are arranged and coupled together as an assemblage or combination of parts that provide for a physical circuit design and related structures. In some instances, a method of designing, providing and building the latch circuitry 302 as an integrated system or device that may involve use of various IC circuit components are described herein so as to implement various configurable latching schemes and techniques associated therewith. Also, the latch circuitry 302 may be integrated with computing circuitry and related components on a single chip, and the latch circuitry 302 may be implemented in embedded systems for electronic, mobile and Internet-of-things (IoT) applications, including sensor nodes.

In some implementations, as shown in FIG. 3, the latch circuitry 302 includes multiple inversion stages, such as, e.g., the first inversion stage (I1), the second inversion stage (I2), the third inversion stage (I3), and/or the fourth inversion stage (I4), which may be arranged and coupled together to provide various configurable latching techniques as described herein. In various implementations, the inversion stages (I1, I2, I3, I4) may be selectively configurable as single-input inverters to operate as two-state inversion logic or multi-input inverters to operate as tri-state inversion logic. In some instances, as shown in FIG. 3, the first inverter (I1) may receive an input signal via node (i) and provide an inverted output signal to node (i+1), and the second inverter (I2) may receive an input signal via node (i+1) and provide an inverted output signal to node (i+2). Also, the third inverter (I3) may receive an input signal via node (i+2) and provide an inverted output signal to node (i+3), and the fourth inverter (I4) may receive an input signal via node (I+3) and provide an inverted output signal to node (i).

In some implementations, the multiple inversion stages (I1, I2, I3, I4) may have multiple switching structures (e.g., transistors) that are arranged and configured to provide configurable inversion logic as two-state inverters or as tri-state inverters (TSI). In some instances, the multiple inversion stages (I1, I2, I3, I4) may be physically designed as tri-state inverters (TSI) that have configurable inversion logic as two-state inversion logic or as tri-state inversion logic. Further, the latch circuitry 302 may also utilize multiple node logic states (i, i+1, i+2, i+3) and multiple binary coefficients (a, b, c, d) that are associated with the inputs and/or outputs of the multiple inversion stages (I1, I2, I3, I4).

For instance, the first inversion stage (I1) may receive a first input signal at node (i), receive a second input signal (a)(i+2), and provide an output signal (i+1), wherein a first binary coefficient (a) may be used to selectively configure the second input (a)(i+2). Also, the second inversion stage (I2) may receive a first input signal at node (i+1), receive a second input signal (b)(i+3), and provide an output signal (i+2), wherein a second binary coefficient (b) may be used to selectively configure the second input (b)(i+3). Also, the third inversion stage (I3) may receive a first input signal at node (i+2), receive a second input signal (c)(i), and provide an output signal (i+3), wherein a third binary coefficient (c) may be used to selectively configure the second input (b)(i). Further, the fourth inversion stage (I4) may receive a first input signal at node (i+3), receive a second input signal (d)(i+1), and provide an output signal (i), wherein a fourth binary coefficient (d) may be used to selectively configure the second input (d)(i).

In some implementations, the latch circuitry 302 may be configured as a latch having the multiple inversion stages (I1, I2, I3, I4) that are selectively configurable as two-input inversion logic or tri-state inversion logic. In various instances, each of the multiple inversion stages (I1, I2, I3, I4) may be selectively configured as first logic gates or second logic gates. For instance, one or more first logic gates may have first switching structures that are configured to operate as two-state inversion logic, and one or more second logic gates may have second switching structures that are configured to operate as tri-state inversion logic. In some instances, the first switching structures may have a first number of transistors, and also, the second switching structures may have a second number of transistors that is greater than the first number of transistors. For instance, in some cases, the first number of transistors may include two transistors, and also, the second number of transistors may include three or more transistors.

Also, in some implementations, one or more first logic gates (e.g., one or more of I1, I2, I3, I4) may be configured as two-state inverters, wherein the two-state inversion logic may be configured to operate as two-transistor (2T) inversion logic. In addition, one or more second logic gates (e.g., one or more of I1, I2, I3, I4) may be configured as tri-state inverters, wherein the tri-state inversion logic may be configured to operate as four-transistor (4T) inversion logic. Further, in this instance, the first switching structures may include at least one p-type transistor and at least one n-type transistor, and the second switching structures may include at least two p-type transistors and at least two n-type transistors. However, in other instances, each of the inversion stages (I1, I2, I3, I4) may be configured as tri-state inverters having two p-type transistors and two n-type transistors having configurable inputs for two-state inversion logic or tri-state inversion logic.

Figure 4A:
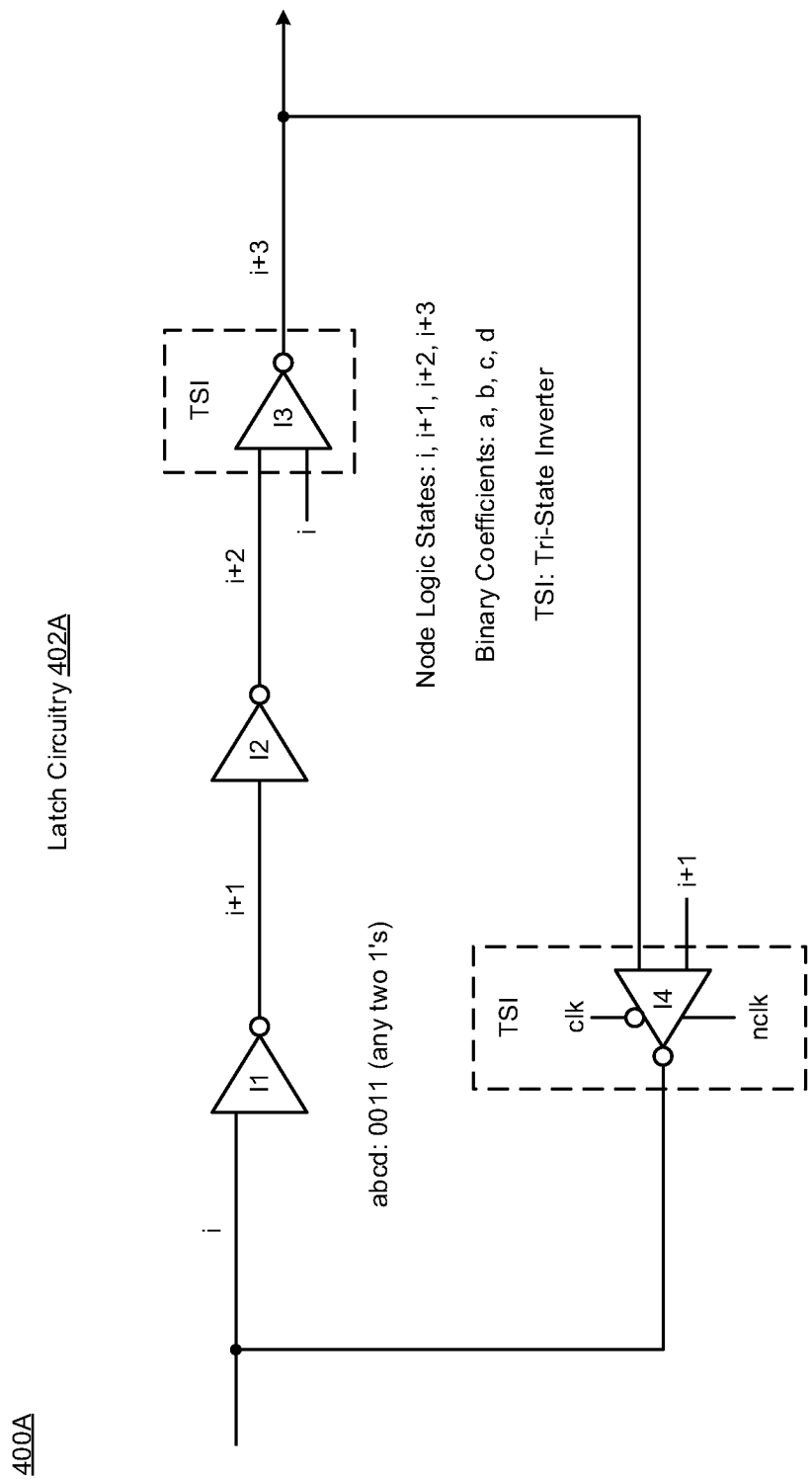
FIGS. 4A-4C illustrate various diagrams of latch circuitry having configurable logic in accordance with various implementations described herein.
Figure 4B:
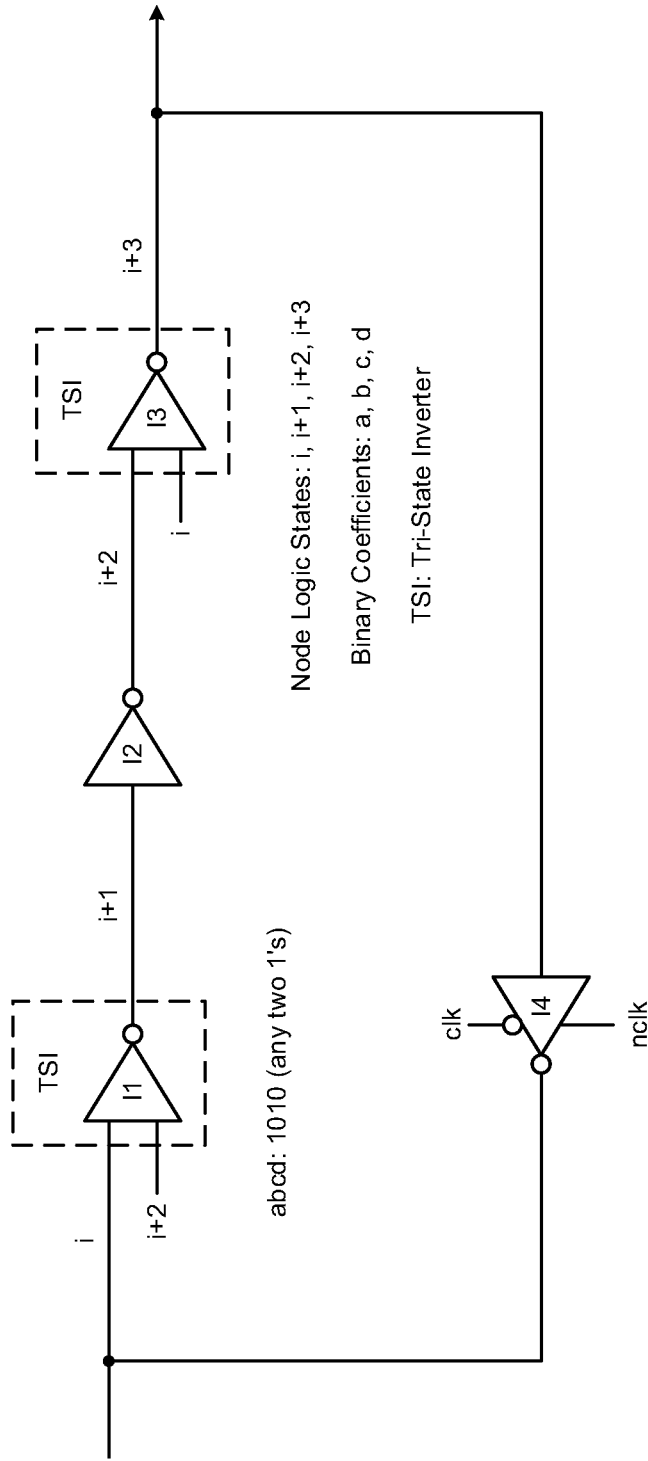
Figure 4C:
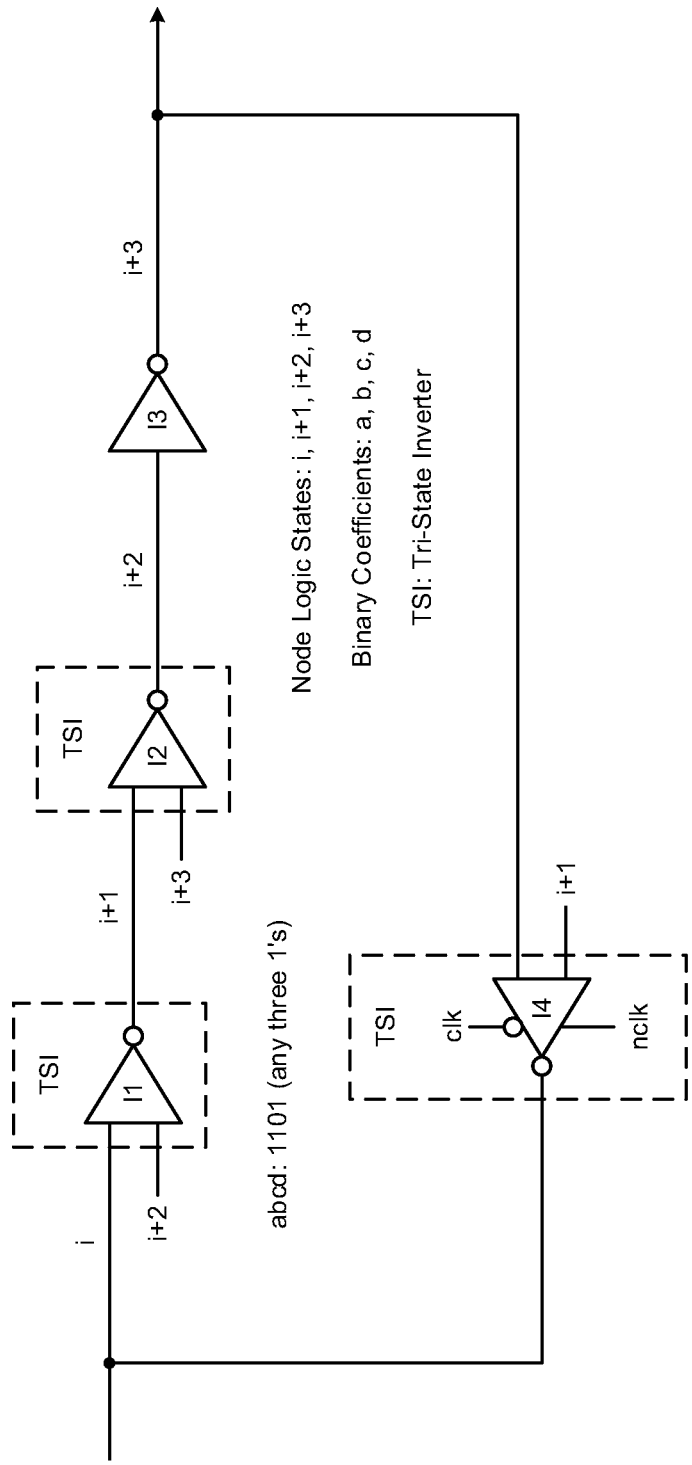

FIGS. 4A-4C illustrate various diagrams of latch circuitry having configurable inversion logic gates in accordance with implementations described herein. In particular, FIG. 4A shows a diagram 400A of latch circuitry 402A having configurable inversion logic gates, FIG. 4B shows a diagram 400B of latch circuitry 402B having configurable inversion logic gates, and FIG. 4C shows a diagram 400C of latch circuitry 402C having configurable inversion logic gates. In various instances, the latch circuitry 402A, 402B, 402C of FIGS. 4A-4C may have similar logic components with similar features and operational characteristics as the latch circuitry 102, 202, 302 in FIGS. 1-3.

In some implementations, as shown in FIG. 4A, the logic circuitry 402A may include the multiple inversion stages (I1, I2, I3, I4), which may be configured as two-state inversion logic or tri-state inversion logic. Also, the inversion stages (I1, I2, I3, I4) may have binary coefficients (a, b, c, d) that are configured as (0011). For instance, the first inversion stage (I1) may be configured as two-state inversion logic with a single input (i) and an output (i+1), and the first binary coefficient (a) is associated with zero (0). Thus, the logical value associated with the first inversion stage (I1) is zero (0). Also, the second inversion stage (I2) may be configured as two-state inversion logic with a single input (i+1) and an output (i+2), and the second binary coefficient (b) is associated with zero (0). Thus, the logical value associated with the second inversion stage (I2) is zero (0). Also, the third inversion stage (I3) may be configured as tri-state inversion logic with two inputs (i+2, i) and an output (i+3), and the third binary coefficient (c) is associated with one (1). Thus, the logical value associated with the third inversion stage (I3) is one (1). Also, the fourth inversion stage (I4) may be configured as tri-state inversion logic with two inputs (i+3, i+1) and an output (i), and the fourth binary coefficient (d) is associated with one (1). Thus, the logical value associated with the fourth inversion stage (I4) is one (1).

In some implementations, as shown in FIG. 4B, the logic circuitry 402B may include the multiple inversion stages (I1, I2, I3, I4), which may be configured as two-state inversion logic or tri-state inversion logic. Also, the inversion stages (I1, I2, I3, I4) may have binary coefficients (a, b, c, d) that are configured as (1010). For instance, the first inversion stage (I1) may be configured as tri-state inversion logic with a two inputs (i, i+2) and an output (i+1), and the first binary coefficient (a) is associated with one (1). Thus, the logical value associated with the first inversion stage (I1) is one (1). Also, the second inversion stage (I2) may be configured as two-state inversion logic with a single input (i+1) and an output (i+2), and the second binary coefficient (b) is associated with zero (0). Thus, the logical value associated with the second inversion stage (I2) is zero (0). Also, the third inversion stage (I3) may be configured as tri-state inversion logic with two inputs (i+2, i) and an output (i+3), and the third binary coefficient (c) is associated with one (1). Thus, the logical value associated with the third inversion stage (I3) is one (1). Also, the fourth inversion stage (I4) may be configured as two-state inversion logic with a single input (i+3) and an output (i), and the fourth binary coefficient (d) is associated with zero (0). Thus, the logical value associated with the fourth inversion stage (I4) is zero (0).

In some implementations, as shown in FIG. 4C, the logic circuitry 402C may include the multiple inversion stages (I1, I2, I3, I4), which may be configured as two-state inversion logic or tri-state inversion logic. Also, the inversion stages (I1, I2, I3, I4) may have binary coefficients (a, b, c, d) that are configured as (1101). For instance, the first inversion stage (I1) may be configured as tri-state inversion logic with a two inputs (i, i+2) and an output (i+1), and the first binary coefficient (a) is associated with one (1). Thus, the logical value associated with the first inversion stage (I1) is one (1). Also, the second inversion stage (I2) may be configured as tri-state inversion logic with two inputs (i+1, i+3) and an output (i+2), and the second binary coefficient (b) is associated with one (1). Thus, the logical value associated with the second inversion stage (I2) is one (1). Also, the third inversion stage (I3) may be configured as two-state inversion logic with a single input (i+2) and an output (i+3), and the third binary coefficient (c) is associated with zero (0). Thus, the logical value associated with the third inversion stage (I3) is zero (0). Also, the fourth inversion stage (I4) may be configured as tri-state inversion logic with two inputs (i+3, i+1) and an output (i), and the fourth binary coefficient (d) is associated with one (1). Thus, the logical value associated with the fourth inversion stage (I4) is one (1).

It should be appreciated that various other implementations of the logic circuitry may include the multiple inversion stages (I1, I2, I3, I4) being configured with varying two-state inversion logic or tri-state inversion logic. In these various instances, the inversion stages (I1, I2, I3, I4) may have various other configurations of binary coefficients (a, b, c, d) that are configured with various logical combinations of binary logical values between all zeroes and all ones, such as, e.g., between (0000, 0001, 0010, . . . , 1111).

Figure 5:
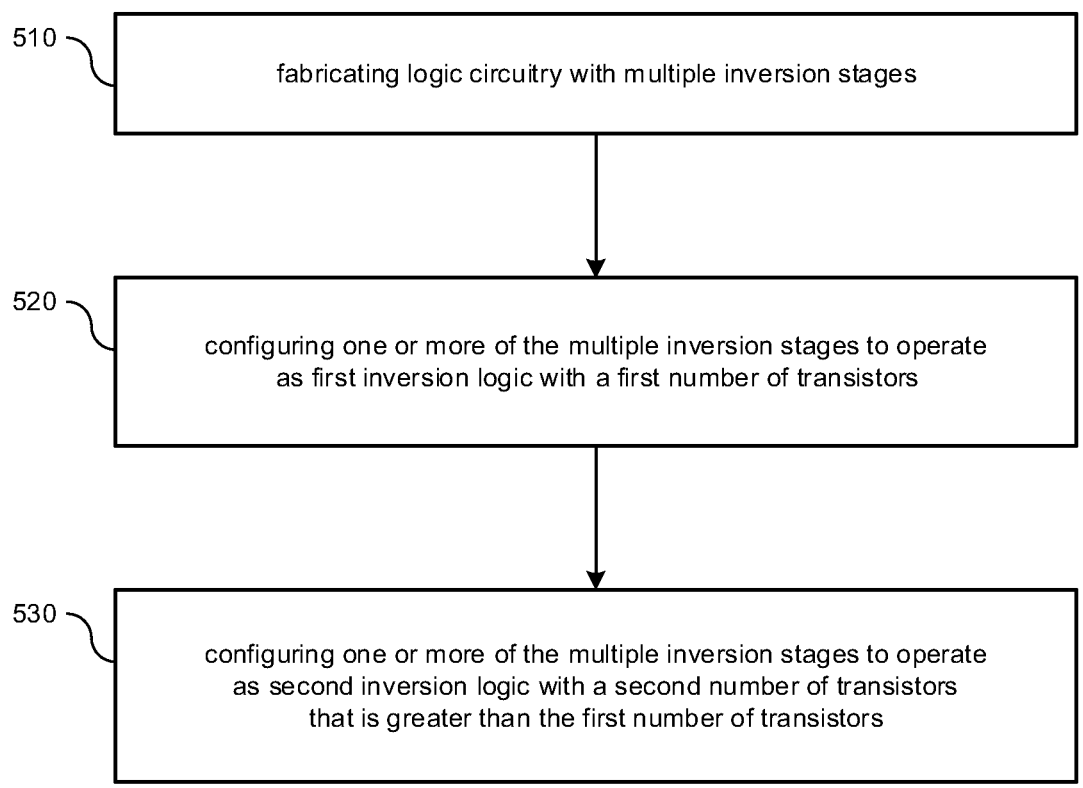
FIG. 5 illustrates a process diagram of a method for providing latch circuitry with configurable logic in accordance with implementations described herein.

FIG. 5 illustrates a process flow diagram of a method 500 for providing latch circuitry with configurable logic in accordance with implementations described herein. In some instances, method 500 may be used to provide configurable inversion logic.

It should be understood that even though method 500 indicates a particular order of operation execution, in some cases, various certain portions of the operations may be executed in a different order, and on different systems. In other cases, additional operations and/or steps may be added to and/or omitted from method 500. Also, method 500 may be implemented in hardware and/or software. If implemented in hardware, the method 500 may be implemented with various components and/or circuitry, as described herein in reference to FIGS. 1-4C. Also, if implemented in software, method 500 may be implemented as a program and/or software instruction process configured for providing configurable latching schemes and techniques, as described herein. Also, if implemented in software, instructions related to implementing the method 500 may be stored in memory and/or a database. For instance, a computer or various other types of computing devices having a processor and memory may be configured to perform method 500.

In various implementations, method 500 may refer to a method of designing, providing, building and/or manufacturing configurable latching circuitry as an integrated system, device and/or circuit that may involve use of the various IC circuit components described herein so as to thereby implement latch configuring schemes and techniques associated therewith. The configurable latching circuitry may be integrated with various computing circuitry and related components on a single chip, and the configurable latching circuitry may be implemented in various embedded systems for various electronic, mobile and Internet-of-things (IoT) applications, including sensor nodes.

At block 510, method 500 may fabricate logic circuitry with multiple inversion stages. At block 520, method 500 may configure one or more of the multiple inversion stages to operate as first inversion logic with a first number of transistors. Also, at block 530, method 500 may configure one or more of the multiple inversion stages to operate as second inversion logic with a second number of transistors that is greater than the first number of transistors. In some instances, the first inversion logic may be configured to operate as two-state inversion logic, and the second inversion logic may be configured to operate as tri-state inversion logic. Also, the first number of transistors may refer to two transistors (2T) that are arranged and configured to operate as two-state inversion logic, and the second number of transistors may refer to three or more transistors (>3T) that are arranged and configured to operate as tri-state inversion logic.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include logic circuitry having multiple inversion stages. One or more of the multiple inversion stages may be configured to operate as first inversion logic with a first number of transistors. One or more of the multiple inversion stages may be configured to operate as second inversion logic with a second number of transistors that is greater than the first number of transistors.

Described herein are various implementations of a latch. The latch may include one or more first logic gates having first switching structures that are configured to operate as two-state inversion logic. The latch may include one or more second logic gates having second switching structures that are to operate as tri-state inversion logic.

Described herein are various implementations of a method. The method may include fabricating logic circuitry with multiple inversion stages. The method may include configuring one or more of the multiple inversion stages to operate as first inversion logic with a first number of transistors. The method may include configuring one or more of the multiple inversion stages to operate as second inversion logic with a second number of transistors that is greater than the first number of transistors.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
    logic circuitry having multiple inversion stages including a first inversion stage, a second inversion stage, a third inversion stage and a fourth inversion stage,
    wherein the first inversion stage is coupled between an output of the second inversion stage and an input of the third inversion stage,
    wherein the fourth inversion stage is coupled between an output of the third inversion stage and an input of the second inversion stage, and
    wherein the logic circuitry comprises latch circuitry, and wherein each of the multiple inversion stages comprises configurable inversion stages that are implemented as two-state inverters or tri-state inverters.

2. The device of claim 1, wherein one or more of the first inversion stage, the second inversion stage, the third inversion stage and the fourth inversion stage are configured to operate as two-transistor (2T) inversion logic.

3. The device of claim 2, wherein:
    the two-transistor (2T) inversion logic comprises one p-type transistor and one n-type transistor.

4. A device, comprising:
logic circuitry having multiple inversion stages including a first inversion stage, a second inversion stage, a third inversion stage and a fourth inversion stage,
wherein the first inversion stage is coupled between an output of the second inversion stage and an input of the third inversion stage,
wherein the fourth inversion stage is coupled between an output of the third inversion stage and an input of the second inversion stage, wherein one or more of the first inversion stage, the second inversion stage, the third inversion stage and the fourth inversion stage are configured to operate as tri-state inversion logic.

5. A device, comprising:
logic circuitry having multiple inversion stages including a first inversion stage, a second inversion stage, a third inversion stage and a fourth inversion stage,
wherein the first inversion stage is coupled between an output of the second inversion stage and an input of the third inversion stage,
wherein the fourth inversion stage is coupled between an output of the third inversion stage and an input of the second inversion stage, wherein one or more of the first inversion stage, the second inversion stage, the third inversion stage and the fourth inversion stage are configured to operate as four-transistor (4T) inversion logic.

6. The device of claim 5, wherein:
the four-transistor (4T) inversion logic comprises two p-type transistors and two n-type transistors.

7. A device, comprising:
logic circuitry having multiple inversion stages including a first inversion stage, a second inversion stage, a third inversion stage and a fourth inversion stage,
wherein the first inversion stage is coupled between an output of the second inversion stage and an input of the third inversion stage,
wherein the fourth inversion stage is coupled between an output of the third inversion stage and an input of the second inversion stage,
wherein the device comprises multiple transmission gates including a first transmission gate coupled to a first input of the logic circuitry and a second transmission gate coupled to a second input of the logic circuitry.

8. A device, comprising:
logic circuitry having multiple inversion stages,
wherein one or more of the multiple inversion stages are configured to operate as first inversion logic with a first number of transistors,
wherein one or more of the multiple inversion stages are configured to operate as second inversion logic with a second number of transistors that is greater than the first number of transistors,
wherein the multiple inversion stages comprise a first inversion stage, a second inversion stage, a third inversion stage and a fourth inversion stage, and wherein:
the first inversion stage is coupled between an output of the second inversion stage and an input of the third inversion stage;
the second inversion stage is coupled between a first input of the logic circuitry and a first output of the logic circuitry;
the third inversion stage is coupled between a second input of the logic circuitry and a second output of the logic circuitry; and
the fourth inversion stage is coupled between an output of the third inversion stage and an input of the second inversion stage.

9. The device of claim 8, wherein:
a first path is coupled between an input of the second inversion stage and an input of the third inversion stage, and
a second path is coupled between an output of the second inversion stage and an input of the fourth inversion stage.

10. The device of claim 8, wherein:
a first path is coupled between a first input of the second inversion stage and a first input of the third inversion stage, and
a second path is coupled between a second input of the third inversion stage and a second input of the second inversion stage.

11. A latch, comprising:
multiple logic gates including a first logic gate, a second logic gate, a third logic gate and a fourth logic gate,
wherein the first logic gate is coupled between an output of the second logic gate and an input of the third logic gate,
wherein the fourth logic gate is coupled between an output of the third logic gate and an input of the second logic gate,
wherein one or more of the multiple logic gates have first switching structures configured to operate as two-state inversion logic, and
wherein one or more of the multiple logic gates have second switching structures configured to operate as tri-state inversion logic.

12. The latch of claim 11, wherein the first switching structures have a first number of transistors, and wherein the second switching structures have a second number of transistors that is greater than the first number of transistors.

13. The latch of claim 12, wherein:
the first number of transistors comprises two transistors, and
the second number of transistors comprises three or more transistors.

14. The latch of claim 11, wherein the switching structures comprise two-state inverters, and wherein the two-state inversion logic is configured to operate as two-transistor (2T) inversion logic.

15. The latch of claim 11, wherein the switching structures comprise tri-state inverters, and wherein the tri-state inversion logic is configured to operate as four-transistor (4T) inversion logic.

16. The latch of claim 11, wherein:
the first switching structures comprise at least one p-type transistor and at least one n-type transistor, and
the second switching structures comprise at least two p-type transistors and at least two n-type transistors.

17. A method, comprising:
fabricating logic circuitry with multiple inversion stages including a first inversion stage, a second inversion stage, a third inversion stage and a fourth inversion stage,
coupling the first inversion stage between an output of the second inversion stage and an input of the third inversion stage,
coupling the fourth inversion stage between an output of the third inversion stage and an input of the second inversion stage,
configuring one or more of the multiple inversion stages to operate as first inversion logic with a first number of transistors, and configuring one or more of the multiple inversion stages to operate as second inversion logic with a second number of transistors that is greater than the first number of transistors.

18. The method of claim 17, wherein:

the first number of transistors comprises two transistors, and the second number of transistors comprises three or more transistors.

19. The method of claim 17, wherein:

the first inversion logic is configured to operate as two-state inversion logic, and the second inversion logic is configured to operate as tri-state inversion logic.

\* \* \* \* \*